United States Patent [19]
Di Domenico, Jr. et al.

[11] 4,163,982
[45] Aug. 7, 1979

[54] SOLID STATE ELECTRICAL SWITCH EMPLOYING ELECTROCHROMIC MATERIAL

[75] Inventors: Mauro Di Domenico, Jr., Basking Ridge; Shobha Singh, Summit; Legrand G. Van Uitert, Morris Township, Morris County, all of N.J.

[73] Assignee: Bell Telephone Laboratories, Incorporated, Murray Hill, N.J.

[21] Appl. No.: 792,192

[22] Filed: Apr. 29, 1977

[51] Int. Cl.² .................................... H01L 45/00
[52] U.S. Cl. ................................. 357/2; 357/1; 350/357; 364/435
[58] Field of Search ............. 357/1, 2; 350/160 R; 364/435

[56] References Cited

U.S. PATENT DOCUMENTS

| | | | |
|---|---|---|---|
| 3,521,941 | 7/1970 | Deb et al. | 350/160 |
| 3,980,505 | 9/1976 | Buckley | 357/2 |

OTHER PUBLICATIONS

S. Deb, "Opt. and Photoel. Prop. of C.C. in Thin Films of Tungsten Oxide," Philosophical Magazine, vol. 27, 1973, pp. 801-822.

M. Green, et al., "A Solid State Electrochromic Cell-The $RbAg_4I_5/WO_3$ System," Thin Solid Films, vol. 24, 1974, pp. 545-546.

B. Faughnan, et al., "Electrochromism in $WO_3$ Amorphous Films," R.C.A. Review, vol. 36, Mar. 1975, pp. 177-197.

Y. Hajimoto, et al., "Coloration in a $WO_3$ film," Applied Physics Letters, vol. 28, No. 4, Feb. 15, 1976, pp. 228-229.

Primary Examiner—Joseph E. Clawson, Jr.
Attorney, Agent, or Firm—Walter G. Nilsen

[57] ABSTRACT

A solid state electrical switch is described which exhibits high off/on resistance ratios and low insertion loss. An additional advantage is that removal of the switching energy does not alter the status (off or on) of the switch. The active solid state material in the switch is an electrochromic material (e.g., tungsten trioxide) which undergoes a transformation from insulator to metallic conductor on injection of certain ions.

5 Claims, 3 Drawing Figures

SOLID STATE ELECTRICAL SWITCH EMPLOYING ELECTROCHROMIC MATERIAL

BACKGROUND OF THE INVENTION

1. Field of the Invention

The invention involves a solid state electrical switch.

2. Description of the Prior Art

Electrical switching is extensively used in electrical apparatus and electrical circuitry for a variety of applications. For example, switches are used to turn on and off certain circuits, including individual telephone lines to various customers. Inherent in such switching properties is amplifier properties and electrical energy (current) control properties. Desirable characteristics for electrically operated switches in modern electrical apparatus is high off/on resistance ratio, low insertion loss, low electrical control energy and permanent latching on removal of control or switching energy.

Solid state switches have many desirable properties which are advantageous in a variety of applications. Absence of mechanical contacts and mechanical movement in the operation of the switch increases the potential and likelihood of long trouble-free life. Generally, less power is required for operation and power requirements can often be tailored (voltage and current exchanged) for most efficient and convenient operation.

SUMMARY OF THE INVENTION

The invention is a solid state switch with material that changes from insulator to metallic conductor on injection of ions under the influence of an electric field. The solid state material undergoes a transformation from insulator to metal conductor on injection of ions using an electric field gradient. Various materials are useful in the practice of the invention provided they undergo such a transformation. Tungsten oxide and molybdenum oxide are typical examples. Tungsten oxide is particularly suitable because of ease of device fabrication using this material and ease of carrying out the phase transformation. These materials are often used for display applications because the insulating and metallic-conducting states have different colors. Various injection ions may be used, particularly monovalent ions such as $H^+$, $Li^+$, $Na^+$, and $K^+$. Certain substances may act as solid electrolytes, such as LiF, NaF, $Li_xWO_3$, $MgF_2$, $SiO_2$, etc. which provides a source (sometimes together with water vapor in the air or solid electrolyte) of injection ions. Solid state switches made in accordance with the invention exhibit high off/on resistance ratios, low insertion loss and the switch remains latched on removal of the control or switching energy.

DETAILED DESCRIPTION

Figure 1:
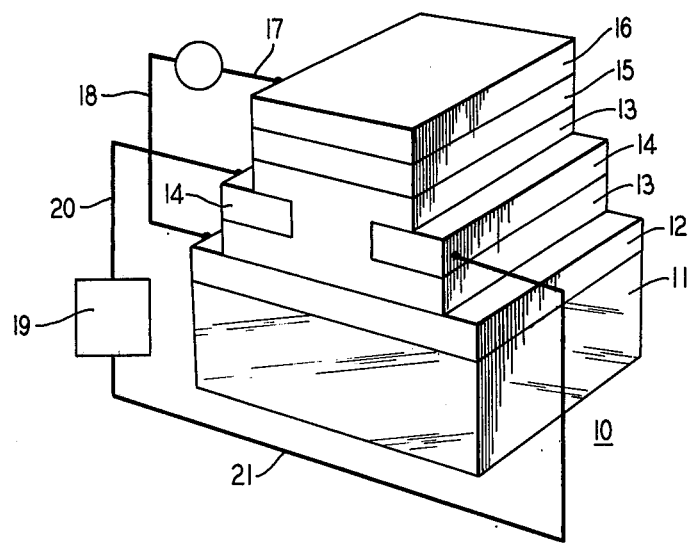
FIG. 1 shows a side view of a structure for a solid state switch made in accordance with the invention.

The invention is a solid state switch employing a material which changes from an insulating state to a conducting state on injection of positive ions under the influence of an electric field. Any material which undergoes such transformation may be used including amorphous, polycrystalline and crystalline. Particularly convenient are electrochromic materials such as tungsten oxide ($WO_3$) and molybdenum oxide ($MoO_3$). Many such materials have been described in the scientific literature. Exemplatory articles are: U.S. Pat. No. 3,521,941, issued July 28, 1970 to S. K. Deb, et al.; "Electrochromism in a $WO_3$ Amorphous Films" by Brian W. Faughnan, et al., *R.C.A. Review* Vol. 36, p. 177 (March 1975); "A Solid State Electrochromic Cell—The $RbAg_4I_51WO_3$" system by M. Green and D. Richman, *Thin Solid Films* 24, S45 (1974); "Coloration in $WO_3$ Film" by Y. Hajimoto and T. Hara, *Applied Physics Letters* 28, p. 228 (February 1976); and "Optical and Photoelectric Properties of Colour Centres in Thin Films of Tungsten Oxide" by S. K. Deb, *Philosophical Magazine* 27, p. 801 (1973). The transformation from insulating to conducting state is controlled by the injection of positive ions under the influence of an electric field. Source of such positive ions may be moisture in the air (for protons) as well as various insulating films as well as solid or liquid electrolytes. Various acids (e.g., $H_2SO_4$) as well as other substances can be used as electrolytes. Structure of the solid state switch may be tailored so as to optimize for particular applications various properties of the switch. For example, off resistance can be traded for insertion loss.

A typical procedure for preparing a solid state switch is as follows: a base is used for convenience to mount one or more switches. The base is usually made of nonconducting material (glass, ceramic, etc.) but where circuit considerations permit (e.g., where the base of several switches are to be electrically connected together) the base may be made of electrically conducting material such as metal. If an insulating base used, a conducting electrode is placed on top of the base. This electrode may be made of a large variety of conducting substances well known in the art including gold, platinum, tin, tin oxide, indium, indium oxide, lead, and alloys of these metals. Next, a layer of the electrochromic substance (e.g., $WO_3$) is evaporated on top of the conducting layer. This is followed by a substance that can act as a source of injection ions. Particular layers are LiF, $MgF_2$, $SiO_2$, etc. that pass or act as sources of protons (perhaps from water vapor) which may be injected into the switching material under the influence of an electric field. Alternately, there may be a layer of $WO_3$ with injected ions (e.g. $Li_xWO_3$, $Na_xWO_3$, etc.) deposited or as part of the switching material (e.g. $WO_3$). Finally, a metallic conducting film is placed on top of the ionic conducting substance. Generally, the top and bottom electrodes are used to control the switch and other electrodes are used to switch the electrical load. These load electrodes may be located in various parts of the material, generally near where injection ions are to be located after injection. These electrodes may be on the side of the material as well as inserted into the material.

Although the exact mechanism by which the insulating material becomes conducting has not been firmly established, it is believed to be due to a reaction between the positive ions and electrons injected into the $WO_3$. This frees electrons in the insulating material. Such a reaction may be represented by the following equation:

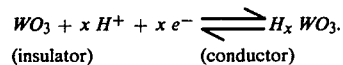

$$WO_3 + xH^+ + xe^- \rightleftharpoons H_xWO_3.$$
(insulator)       (conductor)

It is believed that on ionic injection a large number of relatively free electrons are localized in the oxide lattice which leads to metallic conduction. This process is reversible and the electrochromic material made insulating by reversal of the control or signal current.

Although with some injection ions switching occurs at room temperature, with others, elevated temperatures are generally preferred. For example, with sodium ions temperatures in the range between 70 and 300 degrees C. are preferred. Also amorphous, polycrystalline and single crystal materials are useful in carrying out the invention.

The invention may be clearly illustrated by reference to the structure of an illustrative solid state switch. FIG. 1 shows such a solid state switch 10 with an insulating base 11 generally made of ceramic material. On top of the ceramic material an electrode is found generally made of gold or platinum. The electrochromic material 13 is placed on top of the electrode 12. Other electrodes are embedded in the electrochromic material or placed on the side of the electrochromic material. These electrodes are generally connected to the load which is to be switched. The electrolytic material 15 is placed on top of the electrochromic material and an electrode 16 is placed at the very top. The switching or control circuit is attached by means of wires 17 and 18 to a bottom electrode 12 and the top electrode 16. The load which is to be switched 19 is attached by means of electrical wires 20 and 21 to the electrodes 14 embedded in the electrochromic material.

Figure 2A:
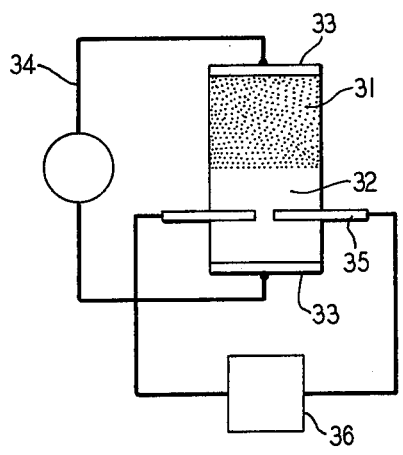
FIGS. 2A, 2B show a diagramed structure, somewhat different than shown in FIG. 1, of a solid state switch made in accordance with the invention.
Figure 2B:
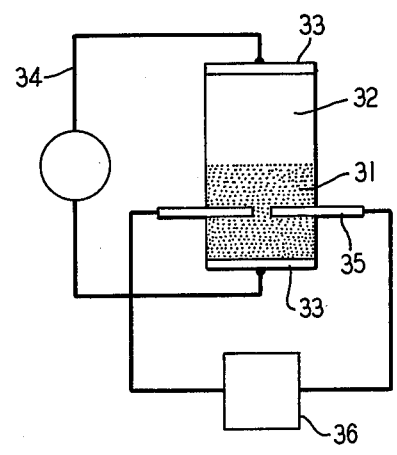

FIG. 2 shows a solid state switch with somewhat different structural features. Here positive ions 31 (generally sodium ions) are already embedded in the electrochromic material 32. Control electrodes 33 and associated circuit 34 are arranged so that the injected ions are away from the load electrodes 35. These load electrodes are part of the load circuit 36. On reversing the polarity of the control circuit, preferably while heating the material, sodium ions migrate down into the gap around the load electrodes 35. This makes the region around the load electrodes metallically conducting which turns on the switch. By allowing the switch to return to a lower temperature, the Na+ ions tend to be trapped in their local sites so that ionic conduction is minimal while electronic conduction proceeds freely. The switch can be reversed by changing the polarity of the control electrodes while heating the material.

What is claimed:

1. A solid state electrical switch which switches a load circuit on and off under the influence of a control circuit comprising
   (a) an insulating base;
   (b) a first control conducting electrode on top of the insulating base;
   (c) an electrochromic material on top of the first conducting electrode, said electrochromic material capable of undergoing a transformation from insulator to metallic conductor on the injection of ions under the influence of an electrical field established by the control circuit;
   (d) an electrolytic material on top of the electrochromic material said electrolytic material capable of injecting positive ions into the electrochromic material, said positive ions selected from the group consisting of $H^+$, $Li^+$, $Na^+$ and $K^+$;
   (e) a second control conducting electrode on top of the electrolytic material which on connecting said first and second control conducting electrode to a control device becomes the control circuit;
   (f) two load electrodes, embedded in the electrochromic material which on electrically connecting the two load electrodes to a load device becomes the load circuit.

2. The solid state electrical switch of claim 1 in which the material is selected from the group consisting of tungsten trioxide and molybdenum trioxide.

3. The solid state electrical switch of claim 2 in which the material is tungsten trioxide.

4. The solid state electrical switch of claim 1 in which the injection ions are contained in the material and moved from a location in the material remote from the load circuit into close proximity with the load circuit by means of an electrical field controlled by the control circuit.

5. The solid state electrical switch of claim 1 in which the switch is heated to effect more rapid switching.

* * * * *